United States Patent [19]
Hoffmann

[11] Patent Number: 5,155,338
[45] Date of Patent: Oct. 13, 1992

[54] CONTROL DEVICE FOR HEATING SOURCES OF COOKING APPRATUS

[75] Inventor: Michel Hoffmann, Cattenom, France

[73] Assignee: Société Scholtes, Thionville-Cedex, France

[21] Appl. No.: 656,998

[22] Filed: Feb. 15, 1991

[30] Foreign Application Priority Data

Feb. 19, 1990 [FR] France ................... 90 01968

[51] Int. Cl.⁵ .............................. H05B 3/74
[52] U.S. Cl. ................... 219/451; 219/448; 219/453; 219/506
[58] Field of Search ............... 219/451, 448, 506, 453; 200/600; 341/33; 307/116

[56] References Cited

U.S. PATENT DOCUMENTS

| | | | |
|---|---|---|---|
| 3,974,472 | 8/1976 | Gould | 307/116 |
| 4,125,783 | 11/1978 | Sefton | 307/116 |
| 4,169,222 | 9/1979 | Tucker | 219/506 |
| 4,924,222 | 5/1990 | Antikidis | 200/600 |

FOREIGN PATENT DOCUMENTS

| | | | |
|---|---|---|---|
| 0042167 | 12/1981 | European Pat. Off. | |
| 2805527 | 1/1979 | Fed. Rep. of Germany | |
| 1464094 | 2/1974 | United Kingdom | 200/600 |
| 2071338 | 9/1981 | United Kingdom | 200/600 |

OTHER PUBLICATIONS

Hoberman, Stu, "Touch Module", Popular Science, Feb. 1973 pp. 124–125.

Primary Examiner—Teresa J. Walberg
Attorney, Agent, or Firm—Roland Plottel

[57] ABSTRACT

Control device for the heating sources of a cooking apparatus, in particular of a cooking surface, possessing a set of neighboring heating sources and a smooth sheet of vitroceramic glass, of uniform thickness, inparticular covering the entire surface, having a plurality of sensitive keys actuated by the approach of a user's finger into contact or into immediate proximity with the surface of the sheet.

According to the invention, each key is associated with a specific source and is formed by the two metal armatures, disposed substantially in the same plane, of a single capacitor carried by a printed circuit board attached under the sheet opposite the upper surface thereof, the capacitor having its first armature connected to a pulse generator and its second armature connected to a differential comparator, the first, peripheral armature having a general U-shaped profile which surrounds the second, central armature in a manner such that the approach of the finger directly over the capacitor but on the other side of the sheet, towards or against its upper surface, modifies its capacitance and causes a change of state at the output of the differential comparator capable of varying the electrical voltage supplied to the source associated with the key.

8 Claims, 2 Drawing Sheets

FIG. 3
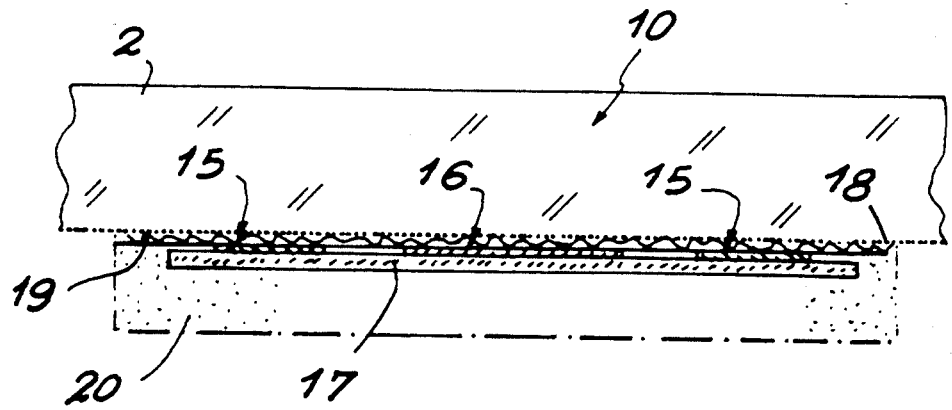
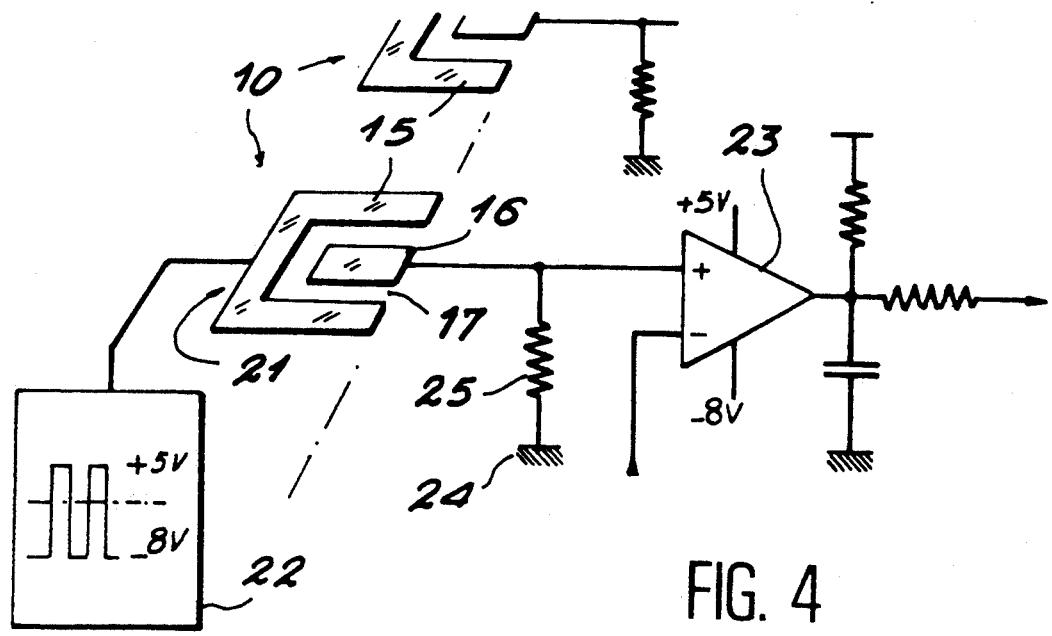
FIG. 4

CONTROL DEVICE FOR HEATING SOURCES OF COOKING APPRATUS

FIELD OF THE INVENTION

The present invention relates to a control device for the heating sources of a cooking apparatus, in particular but not exclusively of a cooking surface or plate, by means of sensitive keys, actuated by simple contact of the user's finger on the top of the plate.

BACKGROUND OF THE INVENTION

Description of the Prior Art

The conventional structure of cooking surfaces is well known, comprising, in the most recent embodiments, separately controlled sources having heating elements constituted either by electrical resistors or, preferably, by what are called halogen lamps, mounted in a support whose base is formed by an adequate thickness of insulating material having reflective properties for the infrared radiation emitted by the heating elements, and the upper part whereof is formed by a sheet of glass on which rest the receptacles containing the foodstuffs to be cooked, directly over the various sources.

The upper sheet may be produced from laminated glass, but in this case cannot generally withstand the high temperature radiated by the heating elements. It is for this reason that, in modern cooking surfaces, the said sheet is constituted by a sheet of vitroceramic material, which is substantially stronger, without consequently impeding the transmission of the radiation originating from the heating elements.

Furthermore, various embodiments of control keys are known, for example from Patent Publications DE-A-2 805 527 and EP-A-0 042 167 which, by a contact action of the user's finger, provide the connection to electrical current of the heating elements, particularly by successive stages or in a regularly increasing or decreasing manner, as the case may be, regulating the efficacy and intensity of the desired heating. These keys may in particular be embodied in the form of electromechanically operating push-down members which require the employment of sealing means at their passage through the sheet of glass, for example with the aid of a flexible film of self-adhesive plastic or the like. However, this solution causes problems of reliability, and especially of service life, the movements of the keys and the flexions of the sealing film resulting therefrom making it impossible to ensure a satisfactory durability over time. Moreover, the presence on the sheet of receptacles which may be very hot is liable to result in the rapid deterioration of the plastic film and to an insulation failure, and hence short circuits in the electrical assembly actuated by the keys.

Another solution consists in using sensitive keys employing resistor or capacitor technology, of the type known for their use in, for example, channel selection in a television receiver or in an audiophonic system. In this case, each key is formed by a thin layer of metallisation deposited on the surface of the glass sheet which possesses, underneath, an electronic circuit comprising one of the armatures of two separate capacitors, the other armatures, mounted in series, being formed by the exterior metallisation layer. The two capacitors, for which the glass sheet fitted between their armatures plays the part of a dielectric material, are disposed in a circuit mounted under the sheet and sending an appropriate signal to an amplifier. When the finger is placed in contact with the outer metallisation layer on the top of the sheet of the key in question, the circuit is earthed via the body of the user himself, between the two capacitors in series, the amplifier then detecting a variation in the supplied signal which makes it possible to control, in the desired direction, the power supply to the heating source associated with the key.

However, though such a system is simple in design and of great reliability, it is unsuitable in the case of cooking surfaces, where the upper working surface is formed by a sheet of vitroceramic glass. This is because, in this case, it is impossible to carry out local metallisation of the upper face of the glass sheet, the latter not permitting a suitable bond with the deposited layer. It is thus essential, if it is desired to employ the conventional solution, to pierce the sheet in order to be able to touch the armature of the capacitor, which is then bonded or otherwise fixed beneath the lower face of this sheet, which causes problems of sealing and of aesthetic appearance. Moreover, in the event of splashing of liquid during cooking or of soiling directly over the key, or accidental contacts with the latter, the heating source will be lit or extinguished at the wrong time, which may have damaging consequences.

In order to remedy the above disadvantages, a method has been disclosed whereby the upper sheet of the apparatus is produced with the aid of a mixed structure comprising, above the heating sources, an appropriate thickness of vitroceramic glass and, attached to the side of the latter, a narrow lateral strip bearing the sensitive control keys, this strip of laminated glass then being able to undergo metallisation of the keys, as in the conventional solutions. However, in this case, the sheet of vitroceramic glass and the strip of laminated glass have to be joined by soldering, adhesive bonding or some other means, which is difficult in mass production, is aesthetically unsatisfactory and, above all, entails risks of breakage during operation, by reason of the differences in expansion of the two types of glass used.

SUMMARY OF THE INVENTION

The present invention relates to a control device employing sensitive keys, applicable to a cooking surface having radiant heat sources, particularly halogen lamps, comprising an upper sheet of vitroceramic glass, that is to say a sheet in which exterior metallisation of the surface thereof, as in the systems known at present, cannot be contemsheetd.

It is likewise an object of the invention to produce sensitive keys, actuated by the simple approach of the user's finger directly over each key, into contact with or into the immediate vicinity of the glass sheet, without it being necessary to attach to the surface thereof any element projecting from or embedded in the sheet, nor to pierce the latter, which enables it to retain its completely smooth and uniform appearance, and further facilitates cleaning thereof and offers the user greater flexibility in the use thereof.

To this end, the device in question, for a cooking apparatus, in particular for a cooking surface, possessing a set of neighbouring heating sources and a smooth sheet of vitroceramic glass, of uniform thickness, in particular covering the entire surface, having a plurality of sensitive keys actuated by the approach of a user's finger into contact or into immediate proximity with the surface of the sheet, is characterised in that each key is associated with a specific source and is formed by the two metal armatures, disposed substantially in the same plane, of a single capacitor carried by a printed circuit board attached under the sheet opposite the upper surface thereof, the capacitor having its first armature connected to a pulse generator and its second armature connected to a differential comparator, the first, peripheral armature having a general profile which encompasses and surrounds the second, central armature in a manner such that the approach of the finger directly over the capacitor but on the other side of the sheet, towards or against its upper surface, modifies its capacitance and causes a change of state at the output of the differential comparator capable of varying the electrical voltage supplied to the source associated with the key.

In contrast, then, to the conventional solutions, where the keys are metallised on the upper surface of the sheet, thus requiring the latter to be of laminated glass but preventing the use of a vitroceramic glass, the invention makes it possible to avoid such metallisation and does not require a direct resistive or capacitive contact with an armature which is common to two capacitors in series and is produced directly by this metallisation. According to the invention, the two armatures of the single capacitor are no longer disposed on either side of the glass sheet but are in the same plane, being carried by a printed circuit board fixed against the sheet and below the latter, the signals supplied by the differential comparator resulting from a varation in the value of the dielectric layer of the capacitor, caused by the approach of the user's finger on the other side of the sheet.

According to a particular feature of the device, the printed circuit board carrying the capacitor, the pulse generator and the differential comparator is embedded in a layer providing insulation and protection against moisture, produced beneath the sheet of vitroceramic glass and retaining the board in close contact therewith. Preferably, in order to achieve a uniform contact between the armatures of the capacitor and the sheet of glass, particularly when the lower surface of the latter is relatively rough, as is usual, a thin intermediate layer of resin is disposed between the glass sheet and the board. However, in other forms of embodiment, the armatures of the capacitor may not be in direct contact with the lower face of the sheet of glass, the circuit board being interposed between the latter and the said armatures.

In a preferred form of embodiment of the invention, the insulating layer in which the board is embedded is constituted by a silicone resin, the thin intermediate layer being formed by means of an epoxy resin or, alternatively, a double-faced self-adhesive transfer film.

According to another feature of the invention, the sensitive keys thus produced are associated two by two with each heating source to bring about respectively, in each pair, an increase and a decrease in the supply voltage delivered to this source, in order to regulate the desired rate of heating.

According to another advantageous feature, the device possesses a supplementary key for generally unlocking all the control keys together with, preferably, a key for locking the latter in their instantaneous state in order to keep the chosen rate of heating constant.

Preferably, likewise, the device incorporates display means for the heating rates, constituted by light-emitting diodes mounted in the vicinity of each of the keys beneath the glass sheet, these diodes, disposed in line, being lit or extinguished one at a time in accordance with the increase or decrease in the power supply of the source associated with each pair of keys.

In general, the sensitive keys are controlled by a microprocessor via a specialised interface circuit which receives all the signals output by the differential comparators associated with these keys. In a particular form of embodiment, the pulse generator corresponding to each key emits rectangular pulses whose amplitude varies between two values, positive and negative respectively, selected so that, in the absence of any action on the key, the potential at the input to the comparator is negative and lower than an input reference, the output being equal to zero, the variation in the capacitance of the capacitor following the movement of the user's finger towards the key returning the potential at the input of the comparator to a positive value, the output likewise changing to a positive value which is detected by the microprocessor in order to control the variation of the voltage supplied to the associated source.

According to another feature, finally, the device possesses additional monitoring means, in particular means capable of cutting the supply to the sources in the event of overflowing of liquids on top of the glass sheet or of action on a key extending beyond a specific length of time, of overheating of the key circuits, or of positioning of hot metal receptacles too close to these circuits.

DESCRIPTION OF THE SEVERAL FIGURES OF THE DRAWING

Other features of a control device for the heating sources of a cooking apparatus, in particular of a cooking surface, employing sensitive keys according to the invention will also become apparent from the description which follows of an example of embodiment, given by way of indication and not limitation, with reference to the attached drawings wherein:

FIG. 3 is a sectional view, on a still larger scale, of a part of the upper sheet of the cooking surface and of the printed circuit affixed beneath the said sheet in order to constitute a control key.

FIG. 4 is a diagrammatic view of the electronic surface corresponding to each of the keys of the surface.

DETAILED DESCRIPTION OF THE PREFERRED EMBODIMENTS

Figure 1:
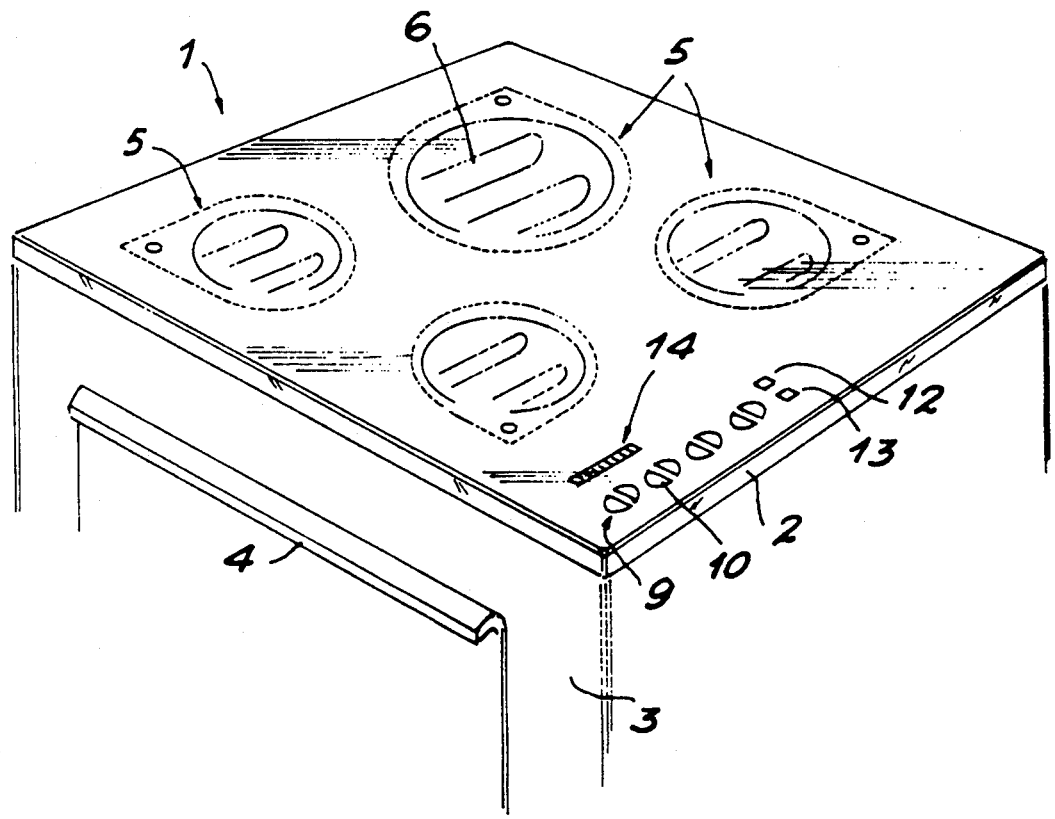
FIG. 1 is a diagrammatic perspective view of a cooking surface fitted with a control device having keys according to the invention.

In FIG. 1, the reference 1 designates a cooking surface whose overall arrangement is conventional per se, this surface possessing in particular an upper sheet 2 of vitroceramic glass resting on a supporting frame 3 which may if desired possess a trap or access door 4, for example for storing cooking utensils or the like (not shown) beneath the surface. The surface 1 possesses, in the example considered, four separate sources generally designated with the reference 5, each source comprising radiant elements 6 constituted, in particular, by halogen lamps. The sheet 2 covers the entire upper surface of the surface 1 in a continuous manner and extends over the sources 5, the infrared radiation emanating from these sources passing through the sheet in a manner such as to heat any receptacle 7 (FIG. 2) placed on the top of the sheet directly over any one of the sources 5. The surface 1 possesses, in a manner known per se, a base 8 which is shown diagrammatically and is preferably produced from a material having suitable qualities of heat insulation and reflectivity, towards the sheet 2, of the rays emanating from the lamps 6.

Provided on one of the lateral sides of the surface 1 is a zone for controlling the rates of heating of the various sources 5, enabling the supply voltage to the lamps, and hence the radiation which they deliver, to be increased or reduced at will, or alternatively enabling the power ratio to be varied in the case of an all-or-nothing control for mixed sources combining halogen lamps and heating resistors, in a manner known per se in the art. The zone 9 is constituted by a set of sensitive keys 10 according to the invention, the detail whereof is described below, these keys together forming a console for controlling the cooking surface and being associated two by two, as FIG. 1 shows, so that each source 5 corresponds to one pair of keys, one serving to increase the power supplied to the associated source at each contact of the user's finger 11 on this key, while the other, conversely, serves to reduce the power of this same source in a stepwise manner.

FIG. 1 likewise shows two supplementary keys, similar to the previous keys, one key 12 serving to perform general unlocking of the set of keys 10 of the surface 1, while the other key 13 enables all the keys to be locked in a given state at the moment when it is actuated, in order to keep the rate of heating of the corresponding source or sources 5 constant. Light-emitting diodes 14, disposed in line, are provided beside the keys 10, in order to display the status of each of the sources, in particular the heating rates imposed thereon by the control of the keys.

Figure 2:
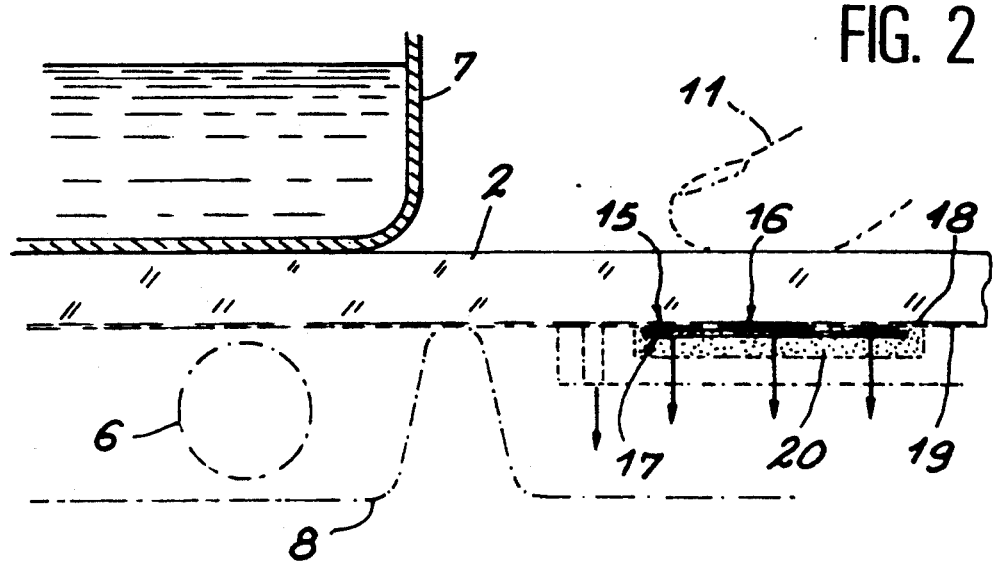
FIG. 2 is a partial section, on a larger scale, of part of the cooking surface according to FIG. 1, particularly in the region thereof comprising control keys.

As can be seen in FIG. 2, and in greater detail in FIG. 3, each of the keys 10 is essentially constituted by two metal armatures, 15 and 16 respectively, the armature 15 or peripheral armature possessing substantially the form of a U (see FIG. 4), while the armature 16, referred to as the central armature, is disposed between the two arms of the peripheral armature 15. The armatures 15 and 16 are situated in the same plane and, in particular, form part of a printed circuit board 17, affixed against the inner face 18 of the sheet of vitroceramic glass 2, the latter generally possessing relatively rough surface, as FIG. 3 shows. Advantageously, this surface 18 is covered with a layer 19 of epoxy resin against which the printed circuit board 17 is applied, the latter in its turn being embedded in an insulating layer 20 of a silicone resin which protects the circuit from moisture, and in particular from the condensation which may form during operation, beneath the sheet 2, as a result of the variations of the heating rates and of the ambient atmosphere. Alternatively, the printed circuit may be completely embedded in a coating of silicone resin which is itself applied and fixed beneath the lower face of the glass sheet, which avoids the use of an intermediate layer of resin.

The two armatures 15 and 16 together form a single capacitor whose dielectric layer is constituted by the environment of these armatures, in particular by the material of the board 17, the layers of resin 19 and 20 and the sheet of vitroceramic glass 2. Of course, the U shape of the peripheral armature associated with a central armature could be modified without departing from the scope of the invention. Thus, it will be possible to envisage a central armature of substantially circular shape and a peripheral armature having a rounded profile, partially surrounding the first. Similarly, the two armatures could be produced in the form of combs whose teeth interlock, each tooth of the second armature preferably being disposed between two parallel teeth of the other armature.

As can be seen in FIG. 4, the capacitor formed by the two armatures 15 and 16, designated as a whole by the reference 21, is connected on the one hand, by the armature 16, to a pulse generator 22 and on the other hand, by the armature 15, to a differential comparator 23, the linkage being connected to earth 24 by a resistor. The generator 22 emits rectangular pulses whose amplitude varies, in the example more specifically shown, between a positive value of $+5$ v and a negative value of $-8$ v. The comparator 23 receives at its negative input a reference voltage of $-0.9$ v and at its positive input, when the corresponding key 10 is not activated, a negative voltage of $-3$ v. The potential at the input to the comparator being less than the reference voltage, the output from the latter is at zero potential.

When the user's finger 11 comes into contact or into immediate proximity to the sheet 2, directly over the key 10 in question, it modifies the value of the dielectric of the capacitor 21 in a manner such that the potential at the input of the comparator 23 is virtually returned to zero. Under these conditions, the output from the said comparator changes from zero to a positive value, which may be detected by a microprocessor (not shown), suitable for controlling all the signals emitted by the keys 10, as a function of demand and of the desired adjustment of the heating rates of the various sources 5.

Advantageously, the device thus produced, having sensitive keys is associated with other control and safety members. Thus, the microprocessor may be programmed so that, when any key is actuated for more than ten seconds, power to the sources is totally discontinued, this situation arising for example in the event of the overflowing of the liquid on top of the sheet 2 or when the user has inadvertently placed any object on the key, unintentionally controlling this key in the same manner as by the contact of the finger in the manner stated above. A continuous or alternating flashing of the diodes 14 may, in this case, alert the user to such a malfunction. In the case of such an anomaly, the power is automatically cut. After correction of the error, it is necessary to act on the unlocking key in order to restore the keyboard to its operating state.

Additionally, a temperature sensor 26 (FIG. 2) may be provided in the vicinity of the keys 10 to bring about, in the same manner, the disconnection of the sources when local overheating arises which might possibly impair the control circuits. Finally, another sensor, magnetic or otherwise (not shown), may likewise be provided to detect the presence of a receptacle in contact with the keys, actuating them at the wrong time, it being possible for this sensor to be connected to an acoustic alarm whose purpose is to alert the user that the receptacle is placed too close to the control zone and the electronic circuits which it comprises.

A control device for the heating sources of a cooking apparatus, employing sensitive keys, is thus produced which requires no metallisation of the upper surface of the sheet of glass, the latter bearing only reference marks produced by silkscreen printing or otherwise on the said surface in order to indicate the positioning of the keys and their association with the various sources. The assembly is safe and reliable and requires no maintenance whatever, the surface of the glass sheet being entirely free, which facilitates its cleaning and maintenance.

Of course, it goes without saying that the invention is not restricted to the example of embodiment more specifically described and shown above; to the contrary, it encompasses all alternative embodiments thereof. In particular, the device enabling the presence of a receptacle to be detected by means of a magnetic or capacitive sensor could be provided in the vicinity of each of the halogen sources, in a manner such as to light each of these only in the event that this receptacle is correctly positioned above the source. Such an arrangement has the advantage that the user is never dazzled by the light enamating from the source, the latter being automatically extinguished when the receptacle is removed, and lighting again with no other action being necessary when the user replaces the receptacle on the top of the sheet.

I claim:

1. Control device for heating sources of cooking apparatus having a cooking surface, comprising
    a continuous smooth sheet of vitroceramic glass of generally uniform thickness and having upper and lower major plane surfaces,
    a set of neighbouring radiant heating sources mounted next to said lower surface of said glass,
    a plurality of sensitive keys disposed adjacent to the lower surface of the glass being actuated by an approach of a user's finger into contact or into immediate proximity with the upper surface of the sheet opposite each key,
    each of the plurality of the keys being connectively associated with a specific one of the set of sources and said each of the plurality of keys consisting of a first and a second of two metal armatures being disposed substantially in the same plane,
    the two metal armatures generally comprising a single capacitor carried by and formed as part of a printed circuit board attached to the lower surface of the sheet,
    the capacitor having the first of the two armatures connected to a pulse generator and the second of the two armatures connected to a differential comparator having an output, and
    the first of the two armatures having profile means which encompasses and surrounds the second of the two armatures in a manner such that the approach of the finger directly over the capacitor but on another side of the sheet, towards or against its upper surface, modifies a value of the capacitance and causes a change of state at the output of the differential comparator to effect varying of electrical power supplied to one of the set of sources, and
    said printed circuit board carrying the capacitor, the pulse generator and the differential comparator is embedded in a layer providing insulation and protection against moisture, and is adjacent the lower sheet of vitroceramic glass and in close contact therewith.

2. A control device according to claim 1, wherein a thin intermediate layer of resin is disposed between the glass forming the sheet and the printed circuit board.

3. A control device according to claim 2, wherein said insulating layer is constituted by a silicone resin, and the thin intermediate layer being formed by means of an epoxy resin.

4. A control device according to claim 1, wherein the sensitive keys are associated two by two, in pairs, with each heating source, to bring about respectively, in each pair, an increase and a decrease in the supply power delivered to the set of sources, in order to regulate a desired rate of heating.

5. A control device according to claim 1, further comprising on said printed circuit board control keys together with a key for locking the latter in an instaneous state, in order to keep a chosen rate of heating.

6. A control device according to claim 1, further comprising
    display means for providing indication of heating rates constituted by light-emitting diodes mounted in the vicinity of each of the keys beneath the glass of the sheet, and
    the diodes disposed in line are lit or extinguished one at a time in accordance with the increase or decrease in the current of the source associated with the each pair of keys.

7. A control device according to claim 1, wherein said sensitive keys are controlled by a microprocessor via interface circuit means which receives all the signals outputed by the differential comparators associated with the keys.

8. A control device according to claim 1, further comprising monitoring means including means capable of cutting the current to the sources responsive to and in the event of overflowing of liquids on top of the glass sheet or of the action extending beyond a specific length of time, of overheating of the keys circuits, or of positioning of hot metal receptacles too close thereto.

* * * * *